(12) United States Patent
Yagihashi et al.

(10) Patent No.: US 8,257,528 B2
(45) Date of Patent: Sep. 4, 2012

(54) SUBSTRATE JOINING METHOD AND 3-D SEMICONDUCTOR DEVICE

(75) Inventors: Fujio Yagihashi, Joetsu (JP); Yoshitaka Hamada, Joetsu (JP); Takeshi Asano, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 99 days.

(21) Appl. No.: 12/540,764

(22) Filed: Aug. 13, 2009

(65) Prior Publication Data

US 2010/0040893 A1 Feb. 18, 2010

(30) Foreign Application Priority Data

Aug. 15, 2008 (JP) ................................ 2008-209194

(51) Int. Cl.
| | |
|---|---|
| B32B 37/00 | (2006.01) |
| B32B 9/04 | (2006.01) |
| C09J 163/00 | (2006.01) |
| C09J 5/06 | (2006.01) |
| C09J 201/00 | (2006.01) |
| H01L 21/20 | (2006.01) |
| H01L 21/50 | (2006.01) |
| H01L 21/52 | (2006.01) |

(52) U.S. Cl. ........... 156/87; 156/325; 156/329; 438/118
(58) Field of Classification Search ................. 156/306.9
See application file for complete search history.

(56) References Cited

U.S. PATENT DOCUMENTS

| | | | |
|---|---|---|---|
| 5,844,060 A | 12/1998 | Furuya et al. | |
| 6,268,457 B1 | 7/2001 | Kennedy et al. | |
| 6,465,368 B2 * | 10/2002 | Inoue et al. | 438/780 |
| 6,930,393 B2 | 8/2005 | Hamada et al. | |
| 7,205,030 B2 | 4/2007 | Misawa et al. | |
| 7,239,018 B2 | 7/2007 | Hamada et al. | |
| 7,402,621 B2 | 7/2008 | Ogihara et al. | |
| 2004/0145040 A1 | 7/2004 | Fukuda et al. | |
| 2007/0093078 A1 | 4/2007 | Harada et al. | |
| 2007/0255003 A1 | 11/2007 | Watanabe et al. | |
| 2008/0026322 A1 | 1/2008 | Ogihara et al. | |
| 2008/0200084 A1 * | 8/2008 | Angus et al. | 442/59 |

FOREIGN PATENT DOCUMENTS

| | | | |
|---|---|---|---|
| EP | 886342 A1 * | 12/1998 | |
| JP | 52112290 A * | 9/1977 | |
| JP | 9-071654 A | 3/1997 | |
| JP | 11-163203 A | 6/1999 | |
| JP | 2004-235310 A | 8/2004 | |
| JP | 2004-269693 A | 9/2004 | |
| JP | 2004-292643 A | 10/2004 | |
| JP | 2004-311532 A | 11/2004 | |
| JP | 2005-142504 A | 6/2005 | |
| JP | 2005-216895 A | 8/2005 | |
| JP | 2007-270125 A | 10/2007 | |
| JP | 2007-314778 A | 12/2007 | |
| JP | 2007-324283 A | 12/2007 | |
| JP | 2008-019423 A | 1/2008 | |
| WO | 2004/059720 A1 | 7/2004 | |
| WO | 2005/053009 A1 | 6/2005 | |

OTHER PUBLICATIONS

Human Translation of JP 52-112290, 1977.*
Japanese Office Action dated Jun. 1, 2011, issued in corresponding Japanese Parent Application No. 2008-209194.
Japanese Office Action date Feb. 2, 2011, issued in corresponding Japanese Patent Application 2008-209194.

* cited by examiner

*Primary Examiner* — Richard Crispino
*Assistant Examiner* — Philip N Schwartz
(74) *Attorney, Agent, or Firm* — Westerman, Hattori, Daniels & Adrian, LLP

(57) ABSTRACT

A pair of substrates each having a bonding surface are joined together by interposing a bond layer precursor coating between the bonding surfaces of the substrates and heating the precursor coating to form a bond layer. Prior to the joining step, the substrate on the bonding surface is provided with a gas-permeable layer. Even when a material which will evolve a noticeable volume of gas upon heat curing is used as the precursor coating, substrates can be joined via a robust bond without the peeling problem by gas evolution.

10 Claims, No Drawings

SUBSTRATE JOINING METHOD AND 3-D SEMICONDUCTOR DEVICE

CROSS-REFERENCE TO RELATED APPLICATION

This non-provisional application claims priority under 35 U.S.C. §119(a) on Patent Application No. 2008-209194 filed in Japan on Aug. 15, 2008, the entire contents of which are hereby incorporated by reference.

TECHNICAL FIELD

This invention relates to a method for joining substrates, typically semiconductor substrates together and a three-dimensional (3-D) semiconductor device.

BACKGROUND ART

While the large-scale integrated circuit (LSI) technology seeks for higher performances, typically to accelerate the data processing speed and to increase the data processing throughput, a number of technologies including lithography have been developed to enable fabrication of finer feature size structures. In the lithography technology, for example, the use of ArF excimer laser exposure has already succeeded in commercial fabrication of 65-nm node devices, and using the immersion lithography, further miniaturization has already been scheduled. However, a possibility is pointed out that a limit will be imposed on the enhancement of performance relying solely on miniaturization, not only from the lithography technology, but also from the technical or material aspect.

Another approach for achieving higher integration density or higher processing speed is to stack LSIs vertically to increase the integration density or processing speed. This three-dimensional (3D) semiconductor integrated circuit has attracted attention as the technology capable of increasing the integration density or processing speed independent of miniaturization, and a number of research works have already been made in the art.

The methods of stacking LSIs vertically include a method of joining LSI-bearing wafers together to form a stack, a method of attaching LSI chips on a LSI-bearing wafer to form a stack, and a method of attaching LSI chips one on top of another to form a stack. In these methods, joining LSI's together is one of key technologies, and the joint is required to be defect-free and robust.

Joining of LSI's together may be either direct or indirect joining. The direct method is to join bonding surfaces directly, and known as silicon fusion bonding or ion plasma bonding. The direct joining method can generally form a joint of high strength, which does not contain any unnecessary third material in principle, and thus has the advantage of high reliability. On the other hand, the method encounters a high technical hurdle because the bonding surfaces are required to have a high flatness and a minimal surface roughness to enable bond formation.

Among the indirect methods, the mounting technique of joining chips to form a stack has been commercially utilized, though within a limited range. For example, JP-A 2007-270125 discloses an insulating sheet of thermosetting resin which is used for forming a bond layer between chips so that a plurality of chips may be stacked.

As an example of forming a joint between wafers, WO 2004059720 (JP-A 2006-522461) discloses a process including building devices on wafers, thinning the wafers, bonding the device-built-in wafers with an insulating material, and forming electrical interconnections between the stacked wafers. The insulating/bonding material used is polyimide.

With respect to the qualities required of the material used to form a bond layer in the indirect method, JP-A 2007-270125 points out the problem that if an insulating sheet having high fluidity is used as a joint between LSI chips, it evolves gas upon curing, which causes peeling. When a bonding sheet in B stage meeting certain physical properties is used, it can be heat cured without raising the peeling problem by gas evolution.

It is pointed out in JP-A 2007-270125 that a bonding material which is heat cured with concomitant gas evolution is not suitable in the bonding of semiconductor devices as described above. Nevertheless, some materials which are preferred for embedment properties and heat stability will evolve a relatively large volume of gas upon heat curing. For example, organic silicon base materials are known to be desirable insulating materials. They have the advantage that their layers do not lose a skeleton structure even when treated at high temperatures in excess of 400° C. However, if a film having a high density of silicon oxide skeleton is to be formed, a relatively large volume of gas inevitably evolves upon heat curing. Then these materials are prone to failures by peeling or unevenness when conventional joining methods are employed.

The above and other patent documents, which are incorporated herein by reference, are listed below.

Citation List
Patent Document 1: JP-A 2007-270125
Patent Document 2: WO 2004059720 (JP-A 2006-522461)
Patent Document 3: WO 2005053009
Patent Document 4: JP-A 2005-216895
Patent Document 5: JP-A 2007-324283
Patent Document 6: JP-A 2007-314778
Patent Document 7: U.S. Pat. No. 6,268,457
Patent Document 8: JP-A 2004-311532
Patent Document 9: JP-A 2004-269693
Patent Document 10: JP-A 2004-292643
Patent Document 11: JP-A 2008-19423
Patent Document 12: JP-A H09-71654

SUMMARY OF INVENTION

The invention addresses the semiconductor device stacking technology. An object of the invention is to provide a method for joining substrates wherein even when a material which will evolve a relatively large volume of gas upon heat curing is used as a bonding material, semiconductor device-built-in substrates can be joined via a robust bond without raising the peeling problem by gas evolution, and a 3D semiconductor device fabricated by the joining method, having high reliability.

The problem of bond failure that when a bond layer precursor coating is heat cured into a bond layer, the bond layer is damaged by the gas from the solvent present in the precursor coating or the gas evolving upon condensation of the precursor coating is apparently solved if the gas is liberated out of the assembly without damaging the bond layer. With respect to porous low-dielectric-constant films which belong to another region of semiconductor device manufacturing material which is also under rapid progress, a variety of films having pores inside have been developed in order to provide a lower dielectric constant than prior art homogeneous materials, for example, bulk silicon oxide. For example, there are known films formed by CVD as described in WO 2005053009, films formed by coating method as described in JP-A 2005-216895, organic silicon base materials as described in JP-A 2007-324283, and non-silicon materials as described in JP-A 2007-314778. The inventors conceived that these porous films could be a means for transmitting gas.

Attempting to produce a stack of substrates on the basis of the above hypothesis by forming a porous film on a substrate, forming a bond layer precursor coating thereon, and joining such substrates, the inventors have found that even when the bond layer precursor coating is made of a material which will evolve gas upon heat curing, the substrates can be joined together without a peeling problem. Insofar as the bond layer precursor coating is a silicon oxide base film made of a silicon oxide base film-forming composition comprising an organic or inorganic silicon oxide base polymer, the substrates can be joined together without a peeling problem even when the porous film is a porous film having pores defined as interstices between particles or so-called mesopores having a radius of about 1 to 10 nm, a porous film having micropores having a radius of up to 1 nm, or a porous film in which no micropores are substantially observable like a spin-on-glass (SOG) film. The invention is predicated on this finding.

In one aspect (Claim 1), the invention provides a method for joining substrates together, comprising the steps of joining a pair of substrates each having a bonding surface with a bond layer precursor coating interposed between the substrate bonding surfaces, and heating the precursor coating to form a bond layer, characterized in that the method further comprises the step of providing one or both of the substrates on the bonding surface with a gas-permeable layer prior to the joining step. The inclusion of the gas-permeable layer in a joint layer between the substrates ensures a tight joint because even when the bond layer precursor coating evolves gas upon heat curing, the gas can find an escape way through the gas-permeable layer, avoiding the risk that the joint between substrates is ruptured by the gas liberated upon heat curing. The number of substrates is not limited to two, and any number of substrates may be successively joined by the inventive method.

In a preferred embodiment (Claim 2), the gas-permeable layer is formed by applying a coating composition comprising a silicon base material and heating the coating so as to be gas permeable. A coating type silicon base film is one of preferred materials from which the gas-permeable film is formed because crosslinks between silicon atoms are formed by heating and a steric skeleton structure containing spaces for passage of gas molecules is thus maintained.

In a preferred embodiment (Claim 3), the silicon base material is a silicon oxide base material. A coating type silicon oxide base material is not only preferred as the gas-permeable layer, but also expected to maintain bond strength even at high temperatures above 400° C.

In a preferred embodiment (Claim 4), the silicon oxide base material comprises an organic silicon oxide compound. Among silicon oxide base materials, the organic silicon oxide compound may be used simply to formulate a relatively stable coating composition.

In another embodiment (Claim 5), the gas-permeable layer is a porous film formed by a chemical vapor deposition (CVD) method and having a dielectric constant k of up to 3. Although a silicon oxide film formed by a plasma-enhanced chemical vapor deposition (PECVD) method using tetraethoxysilane (TEOS) alone is not gas permeable, a CVD porous film having a dielectric constant k of up to 3 can be used as the gas-permeable film.

In another aspect (Claim 6), the invention provides a method for joining substrates together, comprising the steps of joining a pair of substrates each having a bonding surface with a bond layer precursor coating interposed between the substrate bonding surfaces, and heating the precursor coating to form a bond layer, characterized in that the method further comprises the step of providing one or both of the substrates on the bonding surface with a gas-permeable layer prior to the joining step, by applying a silicon oxide base film-forming composition comprising an inorganic or organic silicon oxide base polymer onto one or both of the substrate bonding surfaces and processing the composition into a silicon oxide base film serving as the gas-permeable layer. In this method, at least one substrate is previously provided with a gas-permeable layer by applying a coating composition comprising an inorganic or organic silicon oxide base polymer onto the bonding surface of at least one substrate and heat curing the composition into a silicon oxide base film. When the substrates are then joined by interposing a bond layer precursor coating between the substrate bonding surfaces and heat curing the precursor coating into a bond layer, the gas-permeable layer serves to prevent the bond layer from void formation or peeling even when the bond layer precursor coating is made of a material which will evolve gas upon heating.

In a preferred embodiment (Claim 7), the bond layer precursor coating is a coating comprising an inorganic or organic silicon oxide base polymer. A film resulting from heat curing of the inorganic or organic silicon oxide base polymer can be used as the bond layer in the inventive method and is preferred as a joint layer because it has a high thermal stability and the same etching properties as the substrates.

In a further aspect (Claim 8), the invention provides a 3-D semiconductor device fabricated using the joining method defined above. This 3-D semiconductor device suffers a minimized risk of bond failure and enables a design which is expected to remain highly reliable even when the joining method is followed by high-temperature processing.

In a still further aspect (Claim 9), the invention provides a 3-D semiconductor device comprising substrates joined via a joint layer, the joint layer comprising a gas-permeable layer and a bond layer.

In a preferred embodiment (Claim 10), the gas-permeable layer is formed by applying a coating composition comprising a silicon base material and heating the coating so as to be gas permeable. In a more preferred embodiment (Claim 11), the silicon base material is a silicon oxide base material.

In another preferred embodiment (Claim 12), the gas-permeable layer is a porous film formed by CVD method and having a dielectric constant k of up to 3.

In a preferred embodiment (Claim 13), the bond layer comprises a silicon oxide base compound. The method of the invention permits a silicon oxide base compound to be used as the bond layer. The resulting bond has high stability at high temperatures. Thus a 3-D semiconductor device with high reliability is obtainable.

ADVANTAGEOUS EFFECTS OF INVENTION

Even when a material which will evolve a relatively large volume of gas upon heat curing is used as the bonding material, a robust bond can be formed between semiconductor device-built-in substrates without the peeling problem which would be otherwise raised by gas evolution.

DESCRIPTION OF EMBODIMENTS

While several new problems arise in fabricating a 3-D integrated circuit, serious problems are how to design upper and lower semiconductor devices and how to provide electric interconnects between upper and lower semiconductor devices. It is also a problem how to join semiconductor device-built-in substrates together via a robust bond interposed therebetween. The invention relates to a joining method used to establish a robust bond between semiconductor device-built-in substrates to construct a 3-D semiconductor device, and to a semiconductor device having a specific bond layer.

The semiconductor device stacking technology is utilized not only in the fabrication of three-dimensional integrated circuits, but also in the packaging process of stacking plural semiconductor devices in a semiconductor package. It is pointed out in WO 2004059720 (JP-A 2006-522461) that if a material which will evolve gas upon solidification is used as a bonding material in bonding semiconductor chips, the gas evolved can damage the bond layer to cause voids or peeling.

When semiconductor substrates are joined tightly, sometimes materials which will evolve gas upon solidification may be superior bonding materials. For example, in the case of polyimide film which is a typical insulating material, if polyamic acid is used as a precursor, a noticeable volume of gas evolves upon curing. Further, a silicon base material is an advantageous insulating material which is expected not to lose the function of bond layer even when processed at temperatures as high as 400° C., and it is not a silicone adhesive of addition cure type relying on crosslinking of organic side chains. A silicon base material of the type that cures through formation of Si—O—Si bonds by condensation of silanol groups and that is expected to form a bond layer having high thermal stability is such that it has a degree of condensation of about 60 to 70% when a bond layer precursor comprising the silicon base material is B-staged prior to formation of a bond layer, thus allowing a noticeable volume of water or alcohol to generate from dehydration reaction when it is further heat cured into a bond layer. Then the prior art heat curing method fails to control void formation by gas evolution upon curing. It is believed difficult to join substrates together via a bond layer in the form of a silicon base film, while such a bond layer is merely able to achieve a temporary bonding.

Exemplary processes of joining substrates together include joining of semiconductor device-built-in wafers together, joining of a semiconductor chip as diced to a semiconductor device-built-in wafer, and joining of semiconductor chips together. In either case, the above-discussed problem arises with a material which will evolve gas upon curing, and is inevitable in the joining of wafers together because of a large area of bonding surface.

Making investigations on the method of joining substrates together using a material which will evolve gas upon curing, the inventors have found that when a gas-permeable layer is previously formed on a bonding surface of a substrate to be joined, that is, the surface of a substrate which is to come in contact with a bond layer precursor coating upon joining, the substrates (or wafers) can be joined together via a bond layer without void formation or delamination although the bond layer is made from the material which will evolve gas upon curing. The effect of preventing void formation or delamination is prominent when gas-permeable layers are previously formed on both the bonding surfaces of substrates to be joined. In the embodiment wherein the bond layer precursor coating is formed only on either one of the substrates by applying a bond layer precursor coating-forming composition, better results are obtained when the gas-permeable layer is formed on the other substrate to which the bond layer precursor coating-forming composition is not applied.

The invention is made on the basis of the following working hypothesis although the invention is not limited thereby. The prior art insulating film is generally a bulk silicon oxide film obtained by CVD method using tetraethoxysilane. A porous film having a lower dielectric constant than the prior art insulating film, known as a porous low-k film, is designed such that the dielectric constant is reduced from that of the bulk state by forming pores in the film. In a porous film having a k value equal to or less than 2.5, pores having a radius of about 1 to 10 nm are contained as interstices between particles of which the film is formed, such pores being known as mesopores. Then if a porous film is interposed between a bond layer and a substrate, the gas is liberated through pores so that the bond layer is not damaged. A robust bond is thus established between the substrates.

As will be described later, when a porous layer was previously formed on the basis of the foregoing hypothesis and substrates were joined via a bond layer, a bond could be established between the substrates without delamination or other problems. An investigation was then made on a material which does not substantially contain mesopores, but micropores having a smaller pore size (a pore radius of up to 1 nm). When a coating of a solution comprising an inorganic or organic silicon oxide base polymer is heat crosslinked, a film is formed which contains micropores therein. As an exemplary microporous film, a silicon oxide base film is formed by adding a porogen of a smaller size to a SOG film-forming composition comprising an inorganic or organic silicon oxide resin, applying the resulting solution, and heating. Attempting to form a joint between substrates similarly, but using such a film as the gas-permeable film, the inventors have found that the gas-permeable layer containing micropores also helps form a bond between substrates without delamination. A further experiment was made on a SOG film in which micropores were not observable even by such an instrument as Ellipsometric Porosimeter, confirming that a bond layer with controlled void generation could be formed although the effect declined depending on the pore size.

First described is a mesoporous gas-permeable layer which is useful as the gas-permeable layer to be formed on the bonding surface of a substrate.

With respect to the mesoporous film which has been investigated for its exploitation to semiconductor devices, its application as a low-k insulating film having a lower dielectric constant (or k value) than bulk silicon oxide film was investigated. A number of such films were reported. Any of these films can be used as the gas-permeable film, and among others, silicon oxide base films are useful materials which are expected to have high stability at high temperatures of about 400° C.

A number of methods for forming a silicon oxide base film having mesopores are known. One traditional method involves adding to a heat-curable inorganic or organic silicon oxide base polymer a material which is gasifiable through volatilization or decomposition at a slightly higher temperature than the heat-curing point (known as porogen), applying the mixture to form a film, and sintering the film so that the porogen may escape from within the film, thereby yielding a silicon oxide base film having mesopores, as described in JP-A 2004-311532. A number of materials are known useful as the porogen, including thermally decomposable polymers such as (meth)acrylic polymers, polyethers and polyesters. Also, when polyhydric alcohols of about 5 to 10 carbon atoms having a high boiling point as compared with the coating solvent, and compounds having a relatively small molecular size, for example, thermally decomposable carboxylic acid derivatives such as maleic acid derivatives are added instead, porous films having the majority of micropores rather than mesopores may be prepared.

In forming porous films having mesopores, the use of thermally decomposable polymers as mentioned above is not necessarily essential. If the conditions for synthesis reaction of a silicon oxide base polymer are properly controlled, then a similar film may be prepared using only the silicon oxide base polymer as the film-forming material without a need for porogen. In JP-A 2004-269693, for example, a silicon oxide base polymer is obtained through dehydrolytic condensation of a silane compound with the aid of tetramethylammonium hydroxide and used to form a coating. The coating is then sintered into a low-k film having a dielectric constant of about 2.0 to 3.0. From the dielectric constant value, this film is estimated to be a porous film having mesopores. The presence of pores including mesopores and micropores in a film may be confirmed using an instrument such as Ellipsometric Porosimeter.

The silicon oxide base polymers serving as the main component in the film-forming composition described above may be generally produced by hydrolysis of a hydrolyzable silane or condensation of a silicon compound having a plurality of silanol groups or a salt thereof. The starting reactants and condensation procedure are described in a number of documents including the above-cited ones, and any of them may be used herein. Among others, the preferred reactants used in the preparation of silicon oxide base polymers include hydrolyzable silane compounds as shown below.

Included are tetrafunctional alkoxysilane compounds of the general formula (1):

$$Si(OR^1)_4 \quad (1)$$

wherein $R^1$ is a straight or branched $C_1$-$C_4$ alkyl group, four $R^1$ may be each independently the same or different, and hydrolyzable silane compounds of the general formula (2):

$$R^2{}_m Si(OR^3)_{4-m} \quad (2)$$

wherein $R^2$ is a straight or branched $C_1$-$C_4$ alkyl group, and when a plurality of $R^2$ are included, they may be each independently the same or different; $R^3$ is an optionally substituted, straight or branched $C_1$-$C_8$ alkyl group, and when a plurality of $R^3$ are included, they may be each independently the same or different; and m is an integer of 1 to 3.

Examples of the silane compounds of the general formula (1) which are preferred for use herein include tetramethoxysilane, tetraethoxysilane, tetrapropoxysilane, tetrabutoxysilane, triethoxymethoxysilane, tripropoxymethoxysilane, tributoxymethoxysilane, trimethoxyethoxysilane, trimethoxypropoxysilane, trimethoxybutoxysilane, and analogous silanes having alkyl isomers.

Examples of the silane compounds of the general formula (2) which are preferred for use herein include methyltrimethoxysilane, methyltriethoxysilane, methyltripropoxysilane, methyltributoxysilane, ethyltrimethoxysilane, ethyltriethoxysilane, ethyltripropoxysilane, ethyltributoxysilane, propyltrimethoxysilane, propyltriethoxysilane, propyltripropoxysilane, propyltributoxysilane, butyltrimethoxysilane, butyltriethoxysilane, butyltripropoxysilane, butyltributoxysilane, dimethyldimethoxysilane, dimethyldiethoxysilane, dimethyldipropoxysilane, dimethyldibutoxysilane, diethyldimethoxysilane, diethyldiethoxysilane, diethyldipropoxysilane, diethyldibutoxysilane, dipropyldimethoxysilane, dipropyldiethoxysilane, dipropyldipropoxysilane, dipropyldibutoxysilane, dibutyldimethoxysilane, dibutyldiethoxysilane, dibutyldipropoxysilane, dibutyldibutoxysilane, trimethylmethoxysilane, trimethylethoxysilane, trimethylpropoxysilane, trimethylbutoxysilane, triethylmethoxysilane, triethylethoxysilane, triethylpropoxysilane, triethylbutoxysilane, tripropylmethoxysilane, tripropylethoxysilane, tripropylpropoxysilane, tripropylbu-toxysilane, tributylmethoxysilane, tributylethoxysilane, tributylpropoxysilane, tributylbutoxysilane, and analogous silanes having alkyl isomers.

A number of compositions for forming low dielectric constant porous films are known comprising silicon oxide base polymers prepared from the reactants described above. In addition to the silanes of formulae (1) and (2), many other reactants are also known, for example, in JP-A 2004-292643. In general, any of these reactants may be used.

The above-described hydrolyzable silane compounds alone or in admixture are subjected to dehydrolytic condensation, yielding silicon oxide base polymers. Any combination of these silicon oxide base polymers may be used as a gas-permeable layer-forming material as long as the silicon oxide base polymers resulting from dehydrolytic condensation reach a degree of polymerization sufficient to enable coating and heat curing, i.e., corresponding to a weight average molecular weight of at least about 500, as measured by gel permeation chromatography (GPC) versus polystyrene standards.

Of the foregoing silane compounds, those silane compounds which form silicon oxide base polymers capable of forming a three-dimensional network upon heat curing are preferred in order that a silicon oxide base polymer resulting from dehydrolytic condensation function as a gas-permeable film. In this regard, the preferred reactants should include silane compounds of the above formulae (1) and (2) wherein m=1, and hydrolyzable silane compounds capable of forming at least three crosslinks composed of oxygen atom and/or hydrocarbon, as represented by the following general formulae (3), (4) and (5).

$$Y_r R_{3-r}Si-Z_{a1}(SiR_{2-s}Y_s-Z_{a1})_a-SiR_{3-r}Y_r \quad (3)$$

$$\boxed{(SiR_{2-t}Y_t-Z_{a1})_b} \quad (4)$$

$$Y_r R_{3-r}Si-Z_x(SiR_{3-r}Y_r)_c \quad (5)$$

Herein a is an integer of 1 to 20, r is each independently an integer of 1 to 3, s is an integer of 0 to 2, with the proviso that when all r's are 1, all s's are not equal to 0, b is an integer of 2 to 6, t is an integer of 0 to 2, not all t's being equal to 0, c is an integer of 1 to 4, with the proviso that when c is 1, all r's are not equal to 1; R is an optionally substituted, straight or branched $C_1$-$C_8$ alkyl group and when a plurality of R are included, they may be each independently the same or different; Y is each independently hydrogen, hydroxyl or $C_1$-$C_4$ alkoxy; Za1 is a divalent, optionally cyclic structure-containing straight or branched, or cyclic $C_1$-$C_{10}$ aliphatic hydrocarbon group which may be substituted, wherein an exemplary cyclic structure is:

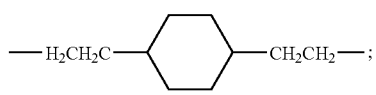

and Zx is an optionally cyclic structure-containing straight or branched, or cyclic (c+1)-valent $C_1$-$C_{10}$ aliphatic hydrocarbon group or an aromatic ring-containing $C_6$-$C_{12}$ hydrocarbon group. A proportion of the hydrolyzable silane compound capable of forming at least three crosslinks composed of oxygen atom and/or hydrocarbon is preferably at least 10 mol % based on the total silane compounds, more preferably at least 30 mol % and may be even 100 mol %. If this proportion is less than 10 molt, the resulting polymers may become difficult to heat cured. If this proportion is equal to or more than 30 molt, sufficient pores are reserved.

The silicon oxide base polymer for use in forming the gas-permeable layer may be produced by subjecting a hydrolyzable silane compound or a mixture thereof as defined above to dehydrolytic condensation in the presence of an acid or basic catalyst. With respect to the dehydrolytic condensation of hydrolyzable silane compounds, a number of documents are known. The methods of dehydrolytic condensation in the presence of acid and base catalysts are described in JP-A 2008-19423, for example.

In the embodiment wherein the acid catalyst is used for dehydrolytic condensation of hydrolyzable silane compounds, suitable catalysts include mineral acids such as hydrofluoric acid, hydrochloric acid, hydrobromic acid, sulfuric acid, nitric acid, perchloric acid, and phosphoric acid, sulfonic acid derivatives such as methanesulfonic acid, benzenesulfonic acid, toluenesulfonic acid and trifluoromethanesulfonic acid, and organic acids having a relatively high acidity such as oxalic acid and maleic acid. The catalyst is used in amounts of $10^{-6}$ to 10 moles, preferably $10^{-5}$ to 5 moles, and more preferably $10^{-4}$ to 1 mole per mole of silicon atoms in the silicon monomer or mixture thereof.

The amount of water added to the hydrolyzable silane compound for allowing dehydrolytic condensation to occur to produce the silicon oxide base polymer is 0.01 to 100 moles, preferably 0.05 to 50 moles, and more preferably 0.1 to 30 moles per mole of hydrolyzable substituent groups bonded to the hydrolyzable silane compound. Adding more than 100 moles of water is uneconomical because the apparatus used for reaction must be extra large.

As to the reaction procedure, a hydrolyzable silane compounds is added to a catalyst aqueous solution whereupon dehydrolytic condensation reaction starts. At this point, an organic solvent may be added to the catalyst aqueous solution and/or the hydrolyzable silane compound may be diluted with an organic solvent. The reaction temperature may be in a range of 0 to 100° C., and preferably 5 to 80° C. In the preferred procedure, the hydrolyzable silane compound is added dropwise at a temperature of 5 to 80° C. and the reaction solution is then matured at a temperature of 20 to 80° C.

Suitable organic solvents that can be added to the catalyst aqueous solution or used to dilute the hydrolyzable silane compound include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl-2-n-amylketone, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, y-butyrolactone, and mixtures thereof.

Of these solvents, water-soluble solvents are preferred. Examples include alcohols such as methanol, ethanol, 1-propanol and 2-propanol, polyhydric alcohols such as ethylene glycol and propylene glycol, polyhydric alcohol derivatives such as propylene glycol monomethyl ether, ethylene glycol monomethyl ether, propylene glycol monoethyl ether, ethylene glycol monoethyl ether, propylene glycol monopropyl ether, and ethylene glycol monopropyl ether, acetone, acetonitrile, and tetrahydrofuran. Of these, those solvents having a boiling point equal to or lower than 100° C. are more preferred.

The organic solvent is preferably used in an amount of 0 to 1000 ml, more preferably 0 to 500 ml per mole of the hydrolyzable silane compound. An excess amount of the organic solvent is uneconomical because the apparatus used for reaction must be extra large.

In the other embodiment wherein the basic catalyst is used, suitable catalysts include methylamine, ethylamine, propylamine, butylamine, ethylenediamine, hexamethylenediamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclooctane, diazabicyclocyclononene, diazabicycloundecene, hexamethylene tetramine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, and calcium hydroxide. The catalyst is used in amounts of $10^{-6}$ to 10 moles, preferably $10^{-5}$ to 5 moles, and more preferably $10^{-4}$ to 1 mole per mole of the hydrolyzable silane compound.

The amount of water added to the hydrolyzable silane compound for allowing dehydrolytic condensation to occur to produce the silicon oxide base polymer is 0.01 to 100 moles, preferably 0.05 to 50 moles, and more preferably 0.1 to 30 moles per mole of hydrolyzable substituent groups bonded to the hydrolyzable silane compound. Adding more than 100 moles of water is uneconomical because the apparatus used for reaction must be extra large.

As to the reaction procedure, a hydrolyzable silane compound is added to a catalyst aqueous solution whereupon dehydrolytic condensation reaction starts. At this point, an organic solvent may be added to the catalyst aqueous solution and/or the hydrolyzable silane compound may be diluted with an organic solvent. The reaction temperature may be in a range of 0 to 100° C., and preferably 5 to 80° C. In the preferred procedure, the hydrolyzable silane compound is added dropwise at a temperature of 5 to 80° C. and the reaction solution is then matured at a temperature of 20 to 80° C.

Suitable organic solvents that can be added to the catalyst aqueous solution or used to dilute the hydrolyzable silane compound include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl-2-n-amylketone, propylene glycol monomethyl ether, ethylene glycol monomethyl ether, propylene glycol monoethyl ether, ethylene glycol monoethyl ether, propylene glycol dimethyl ether, ethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, y-butyrolactone, and mixtures thereof.

Of these solvents, water-soluble solvents are preferred. Examples include alcohols such as methanol, ethanol, 1-propanol and 2-propanol, polyhydric alcohols such as ethylene glycol and propylene glycol, condensed derivatives of polyhydric alcohols such as propylene glycol monomethyl ether, ethylene glycol monomethyl ether, propylene glycol monoethyl ether, ethylene glycol monoethyl ether, propylene glycol monopropyl ether, and ethylene glycol monopropyl ether, acetone, acetonitrile, and tetrahydrofuran. Of these, those solvents having a boiling point equal to or lower than 100° C. are more preferred.

The organic solvent is preferably used in an amount of 0 to 1000 ml, more preferably 0 to 500 ml per mole of the hydrolyzable silane compound. An excess amount of the organic solvent is uneconomical because the apparatus used for reaction must be extra large.

Thereafter, the catalyst is neutralized if necessary, and the alcohol formed during dehydrolytic condensation is removed under vacuum, yielding the reaction mixture in aqueous solution form. When the base is used as the catalyst, an acidic substance may be used for neutralization, preferably in an amount of 0.1 to 2 equivalents relative to the base. Any of acidic substances which exhibit acidity in water may be used for the neutralization purpose.

The silicon oxide base polymer thus obtained may be dissolved in an organic solvent, which may contain water, to formulate a bond layer precursor coating-forming composition. Any organic solvents may be used as long as the solvent has an appropriate volatility under particular coating conditions and the silicon base polymer is dissolvable therein. Preferred examples of the solvent used herein include aliphatic hydrocarbon solvents such as n-pentane, isopentane, n-hexane, isohexane, n-heptane, 2,2,2-trimethylpentane, n-octane, isooctane, cyclohexane, and methylcyclohexane; aromatic hydrocarbon solvents such as benzene, toluene, xylene, ethylbenzene, trimethylbenzene, methylethylbenzene, n-propylbenzene, isopropylbenzene, diethylbenzene, isobutylbenzene, triethylbenzene, diisopropylbenzene, and n-amylnaphthalene; ketone solvents such as acetone, methyl ethyl ketone, methyl n-propyl ketone, methyl n-butyl ketone, methyl isobutyl ketone, cyclopentanone, cyclohexanone, 2-hexanone, methylcyclohexanone, 2,4-pentanedione, acetonylacetone, diacetone alcohol, and acetophenone; ether solvents such as ethyl ether, isopropyl ether, n-butyl ether, n-hexyl ether, 2-ethyl hexyl ether, dioxolane, 4-methyldioxolane, dioxane, dimethyldioxane, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol dimethyl ether, diethylene glycol monoethyl ether, diethylene glycol diethyl ether, diethylene glycol monopropyl ether, diethylene glycol dipropyl ether, diethylene glycol monobutyl ether, diethylene glycol dibutyl ether, tetrahydrofuran, 2-methyltetrahydrofuran, propylene glycol monomethyl ether, propylene glycol dimethyl ether, propylene glycol monoethyl ether, propylene glycol diethyl ether, propylene glycol monopropyl ether, propylene glycol dipropyl ether, propylene glycol monobutyl ether, dipropylene glycol dimethyl ether, dipropylene glycol diethyl ether, dipropylene glycol dipropyl ether, and dipropylene glycol dibutyl ether; ester solvents such as diethyl carbonate, ethyl acetate, γ-butyrolactone, γ-valerolactone, n-propyl acetate, isopropyl acetate, n-butyl acetate, isobutyl acetate, sec-butyl acetate, n-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, dipropylene glycol monomethyl ether acetate, dipropylene glycol monoethyl ether acetate, dipropylene glycol mono-n-butyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propanesultone. These solvents may be used alone or in admixture.

The reaction mixture of silicon oxide base polymer resulting from condensation reaction is generally washed with water and treated for metal removal by ion exchange before its solvent is exchanged with a coating-compatible solvent. If necessary, a porogen as mentioned above, surfactant, pH stabilizer or the like is added. The subsequent concentration adjustment with the coating solvent yields a gas-permeable film-forming composition. The coating solvent used herein may be selected from various solvents which are used to adjust ordinary composition solutions containing silicon oxide base polymers. A number of such solvents are known in the art, including the foregoing solvents as well as those solvents described in the above-cited JP-A 2005-216895, JP-A 2007-324283, U.S. Pat. No. 6,268,457, JP-A 2004-311532, JP-A 2004-269693, JP-A 2004-292643, JP-A 2008-19423, and JP-A H09-71654. Any of these solvents may be used. The concentration is adjusted depending on the desired film thickness. When a film having the same thickness as the porous film is to be formed, reference should be made to JP-A 2005-216895, JP-A 2007-324283, U.S. Pat. No. 6,268,457, JP-A 2004-311532, JP-A 2004-269693, JP-A 2004-292643, JP-A 2008-19423, and JP-A H09-71654. The solids concentration of the composition solution may be adjusted such that the film as finally heated may have a thickness of about 300 to 1,000 nm. Specifically, the solids concentration may be adjusted in accordance with a particular silicon oxide base polymer used and coating conditions. In general, the solids concentration is 0.1 to 30% by weight, and preferably 0.2 to 20% by weight.

In general, the gas-permeable film-forming composition prepared as above is filtered for foreign matter removal and applied onto a substrate as by coating, to form a gas-permeable film thereon. A number of methods are known in the art for applying or coating a film-forming composition comprising a polymer and processing it to form a film. When a film is formed on a substrate having a relatively large surface area, typically wafer, film formation by spin coating is preferred because a film having a high flatness is readily formed.

Once the composition in solution form is applied to form a coating, the coating is heated for evaporating off the residual solvent in the coating and further heated to induce crosslinks between polymer molecules to form a mechanical structure capable of retaining mesopores or micropores within the film so that the film may serve as a gas-permeable film. These two heating steps need not necessarily be performed in two stages, although two stages of heating are preferred to prevent the film from suffering cracks and defects.

In general, the first heating stage for drying is at 80 to 250° C. for 30 seconds to 5 minutes, and the second heating stage for forming inter-polymer crosslinks is at 200 to 450° C. for 1 to 60 minutes.

During the second heating stage, Si—O—Si bonds are formed between silanol groups remaining in free state in the film of silicon oxide base material, which results in a film skeleton having a sufficient strength to prevent mesopores or micropores from collapsing upon heating. Thus gas permeability is not lost even when high-temperature treatment is involved in the joining step.

With respect to the thickness of a film that permits the film to function as a gas-permeable film, a film having a thickness of about one-half of the thickness of the bond layer precursor coating used in the joining step displays sufficient gas permeability. When ease of application leading to flatness or the like is taken into account, it is recommended that the film have a thickness of about 300 to 1,000 nm after the second heating stage.

The other well-known method of forming a porous film relies on chemical vapor deposition (CVD). A number of materials which can be used in the CVD are known, for example, from WO 2005053009. This method starts with cyclic siloxane compounds having hydrocarbon and alkoxy groups, as represented by the general formula (6):

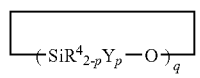

(6)

wherein $R^4$ is an optionally cyclic structure-containing, straight or branched, saturated or unsaturated aliphatic hydrocarbon group of 1 to 10 carbon atoms, Y is each independently hydrogen, hydroxyl, or $C_1$-$C_4$ alkoxy, p is an integer of 0 to 2, with the proviso that when $R^4$ is a saturated aliphatic hydrocarbon group, not all p's are equal to 0, and q is an integer of 3 to 5, especially derivatives thereof having vinyl groups, or straight or branched organosiloxane compounds having hydrocarbon and alkoxy groups. Plasma polymerization reaction or reaction with an oxidant gas or silicon hydride gas is effected on these compounds to introduce minute pores in an organic silicon oxide base film. A porous film formed by this method may also serve as the gas-permeable film.

In an alternative embodiment, a film which contains only a few mesopores and mainly finer micropores (having a radius equal to or less than 1 nm) may also serve as the gas-permeable film, despite a slightly inferior gas transmissibility.

Known silicon oxide base films having micropores include silicon oxide base films which are prepared by using a silicon oxide base polymer obtained through hydrolysis of a hydrolyzable silane (which is a useful starting reactant to form a mesoporous film) in the presence of an acid catalyst (see JP-A 2008-19423 and JP-A H09-71654), adding a porogen of the above-defined size thereto, and applying the mixture to form a film. The method for the formation of a gas-permeable layer having micropores from the silicon oxide base polymer is the same as the formation of mesoporous film described above, except that the solids materials used are different.

When silicon oxide base polymers in which micropores are not observable, that is, SOG film-forming materials are sintered without adding porogen, there are formed films in which micropores are not observable even by an Ellipsometric Porosimeter. Even when such films are used, a gas-permeable film function is available although their effect is somewhat inferior to that of microporous films.

The method for joining substrates together according to the invention comprises the steps of preparing a pair of substrates to be joined each having a bonding surface, providing one or both of the substrates on the bonding surface with a gas-permeable layer, interposing a bond layer precursor coating between the bonding surfaces of the substrates, and heating the precursor coating to form a bond layer, thus completing a joint.

Better results are obtained when the gas-permeable layers are provided on both the bonding surfaces of substrates which come in contact with a bond layer precursor coating. In an embodiment wherein the bond layer precursor coating-forming composition in solution form is applied onto one substrate and processed to form a bond layer precursor coating and the coated substrate is then joined to another substrate via the bond layer, it is advantageous that at least the other substrate on which the bond layer precursor coating is not deposited be provided with the gas permeable layer. This is because the more fresh gas-permeable layer which has not contacted with the coating solvent is available upon heat curing.

In the substrate joining method, the bond layer precursor coating material which can take advantage of the invention is a material which will evolve gas through reaction such as condensation reaction when heat cured into a bond layer. When the method is applied to the process of fabricating a device including a joining step and a post-working step under high-temperature conditions, typically at 400° C., the bond layer is also required to have heat resistance. Silicon base polymers are also advantageous as the bond layer precursor coating material capable of forming a bond layer having such heat resistance. Thus the silicon oxide base polymers which are advantageous as the material for forming the gas-permeable layer are also useful for forming the bond layer.

In general, the silicon oxide base polymer which can be used to form the bond layer precursor coating may be any of silicon oxide base polymers having silicon units substituted with hydrogen, hydroxyl or alkoxy groups. When such a polymer is coated and heated, it cures through the mechanism that Si—O—Si crosslinks are introduced between polymer molecules, eventually forming a bond layer. Thus a choice may be made from a wide variety of materials.

Preferred materials which can be used to form the bond layer precursor coating include silicon oxide base polymers obtained through dehydrolytic condensation by any well-known methods of hydrolyzable silane compounds alone or a mixture thereof containing hydrolyzable silane compounds of the general formulae (1) and (2).

Also, polymers are obtainable through dehydrolytic condensation by any well-known methods of hydrolyzable silane compounds alone or a mixture thereof containing polynuclear silicon base hydrolyzable silanes having a structure comprising a plurality of silicon atoms and crosslinked with hydrocarbon chains between at least one pair of silicon atoms and having at least three hydrolyzable groups selected from hydrogen, hydroxyl and alkoxy groups, typically compounds of the general formulae (3), (4) and (5). These polymers are effective to form a bond layer which has a lower modulus of elasticity and prevents the occurrence of bond failures by thermal shocks after joining.

Examples of the divalent hydrocarbon chains between silicon atoms include straight aliphatic hydrocarbons such as methylene, ethylene, propylene, butylene, and hexylene, cyclic structure-containing aliphatic hydrocarbons such as cyclohexylene, dimethylenecyclohexylene, norbornylene, and adamantylene, and aromatic hydrocarbons such as phenylene, naphthylene and anthracenylene.

Where three or more silicon atoms are included, aliphatic chains include a structure wherein a branch from a carbon atom in the divalent aliphatic chain bonds at its end with a silicon atom, and an array of three or more silicon atoms wherein silicon atoms and hydrocarbon chains are alternately arranged. Aromatic chains include a structure in which a carbon atom bondable with a silicon atom is attached to a carbon atom in the aforementioned divalent aromatic groups.

Like the preparation of the gas-permeable layer-forming material described previously, a polymer may be prepared by dehydrolytic condensation of the hydrolyzable silane compound. Herein, any polymers may be used as long as a material which can be coated and heat cured under vacuum conditions as will be described later may be formulated therefrom. Polymers with a molecular weight of at least 500 are preferred to facilitate coating and film formation. Accordingly, the condensation conditions which can be employed herein may be the above-described conditions. Use may be made of the methods described in the above-cited JP-A 2005-216895, U.S. Pat. No. 6,268,457, JP-A 2004-311532, JP-A 2004-269693, JP-A 2004-292643, JP-A 2008-19423, and JP-A H09-71654.

The silicon oxide base polymer obtained by condensation as described above may be processed like the preparation of the gas-permeable layer-forming material described previously. Specifically, the reaction mixture resulting from condensation reaction is generally treated for metal removal before its solvent is exchanged with a coating-compatible solvent. The coating solvent used herein may be selected from the aforementioned solvents. Use may also be made of the solvents described in the above-cited JP-A 2005-216895, JP-A 2007-324283, U.S. Pat. No. 6,268,457, JP-A 2004-311532, JP-A 2004-269693, JP-A 2004-292643, and JP-A 2008-19423. If necessary, auxiliary additives such as surfactants and pH stabilizers are added, and a coating solvent is added for concentration adjustment. This is generally followed by filtration to remove foreign matter, yielding a bond layer precursor coating-forming composition. The solids concentration of the composition solution may be adjusted such that the bond layer precursor coating may have a thickness of about 300 to 1,500 nm. Specifically, the solids concentration must be adjusted in accordance with a particular silicon oxide base polymer used and coating conditions. In general, the solids concentration is 0.1 to 40% by weight, and preferably 0.2 to 30% by weight.

The bond layer precursor coating may be prepared by applying the bond layer precursor coating-forming composition onto a release substrate, forming a precursor film, and peeling therefrom the precursor film, which is then interposed between substrates to be joined. To form a thin bond layer to achieve a joint, the process involving applying the bond layer precursor coating-forming composition directly onto at least one of substrates to be joined, forming the bond layer precursor coating, and mating the substrates so that the bond layer precursor coating is sandwiched therebetween is advantageous.

Formation of the bond layer precursor coating may be performed by coating the bond layer precursor coating-forming composition onto a substrate as an object to be coated, by any well-known techniques. Likewise, when the composition is applied to wafers or the like, spin coating is advantageous.

The coating as applied above may be used as a bond layer precursor coating after an excess of the solvent is evaporated off. Since the coating contains a noticeable amount of the coating solvent in addition to potential gas evolution upon heat curing, the coating is preferably heated for evaporating off the residual solvent in the coating. Even though the gas-permeable layer is used, it is advantageous in suppressing void formation during the joining step that the amount of gas resulting from curing reaction during curing is reduced to some extent. Thus, the bond layer precursor coating is preferably B-staged prior to the heat curing step, that is, crosslinking reaction has taken place in the precursor coating to such an extent that bond formation is not obstructed.

If the bond layer precursor coating is sintered at high temperature as in the second heating stage described in conjunction with the formation of the gas-permeable layer, the bond layer precursor coating is fully cured, losing adherence. However, if the bond layer precursor coating is heated at a lower temperature than the curing temperature so that some of active groups capable of forming crosslinks may form crosslinks, then the bond layer precursor coating maintains adherence. The temperature for B-staging varies with a particular material although the preferred guidance is by heating at 120 to 230° C. for 30 seconds to 3 minutes.

Now the substrates, at least one of which has been provided with a gas-permeable layer, are joined via a bond layer precursor coating. Generally under vacuum conditions, an assembly of bond layer precursor coating between substrates (one bearing gas-permeable layer) is compressed and heated whereby the bond layer precursor coating is heat cured into a bond layer to complete a joint or bond between substrates. Although the degree of vacuum of the atmosphere is preferably higher, a high vacuum is not acceptable because the organic solvent remains in the bond layer precursor coating. The joining step is generally carried out in a vacuum of 500 to 5,000 Pa while applying a load of 1,000 to 60,000 N to the assembly. For completing a bond, heating at high temperature is necessary. The temperature is not particularly limited as long as the bond layer precursor coating can be cured, and the assembly is usually heated at 200 to 450° C. for 1 to 120 minutes.

A variety of methods may be employed in forming interconnections between the substrates to be joined. Although interconnections are not described in detail, a metal conductor must be buried in substrates at sites where interconnections between the substrates are to be formed. Thus only a portion of the precursor film material at the site is removed prior to the second heating stage so that the gas-permeable film may not be formed at the site. Alternatively, after the gas-permeable film is completed, a portion thereof is etched away using a resist material and the like. Bumps may be formed by burying a metal in the space where the gas-permeable film has been etched away using a resist material and the like. With this method, the height of bumps may be controlled by selecting the thickness of a resist film as appropriate.

In an alternative approach, upper and lower substrates are joined together without interconnections therebetween. One substrate is thinned by chemical mechanical polishing (CMP) or the like, if desired, then a hole which extends throughout the thinned substrate and the bond layer is provided, and a metal is buried in the hole to form an interconnect. In this case, another advantageous effect is obtained that the gas-permeable layer and the bond layer formed of silicon oxide base materials which have been described in detail as the preferred material for the joint layer according to the invention are amenable to etch processing by dry etching under the same conditions as silicon substrates.

EXAMPLE

Examples of the invention are given below by way of illustration and not by way of limitation. Herein, GPC is gel permeation chromatography, and PGMEA is propylene glycol monomethyl ether acetate.

Preparation of silicon oxide base Polymers

Preparation Example 1

With stirring, a solution of 188.4 g of ethanol, 93.44 g of ultrapure water, and 8.26 g of 25% aqueous tetramethylammonium hydroxide was heated at 60° C. To this solution, a mixture of 19.5 g of methyltrimethoxysilane and 36.43 g of tetraethoxysilane was added dropwise over 6 hours. The resulting reaction solution was cooled in an ice water bath to room temperature, after which 2 g of oxalic acid and 200 ml of PGMEA were added thereto. From the resulting solution, the solvent was distilled off on an evaporator until the residual liquid was 161 g. To the residual liquid were added 200 g of ethyl acetate and 120 g of ultrapure water. Using a separatory funnel, the resulting liquid was washed and kept stationary. After the water layer was removed, the organic layer was further washed twice with 120 ml of ultrapure water. To the organic layer was added 120 ml of PGMEA. On an evaporator, the solvent was distilled off, yielding 208 g of the concentrated solution, which is a gas-permeable film-forming composition mother liquid. This solution had a nonvolatile content of 21.3% by weight. On analysis of this material by GPC, the values measured were not regarded appropriate, but it was confirmed that the material had been fully condensed.

Preparation Example 2

Synthesis was performed as in Preparation Example 1 except that the time of dropwise addition of the silane mixture was changed from 6 hours to 4 hours. There was obtained 204 g of a concentrated solution, which had a nonvolatile content of 22.9% by weight. On analysis of this material by GPC, the values measured were not regarded appropriate, but it was confirmed that the material had been fully condensed.

Preparation Example 3

Synthesis was performed as in Preparation Example 1 except that the time of dropwise addition of the silane mixture was changed from 6 hours to 1 hour. There was obtained 214 g of a concentrated solution, which had a nonvolatile content of 18.9% by weight. On analysis of this material by GPC, the values measured were not regarded appropriate, but it was confirmed that the material had been fully condensed.

Preparation Example 4

Synthesis was performed as in Preparation Example 1 except that the time of dropwise addition of the silane mixture was changed from 6 hours to 1 hour and the amount of aqueous tetramethylammonium hydroxide was 16.5 g. There was obtained 188 g of a concentrated solution, which had a nonvolatile content of 21.0% by weight.

Preparation Example 5

Reaction was performed as in Preparation Example 1 except that 38.9 g of trimethoxysilane was used instead of the mixture of 19.5 g of methyltrimethoxysilane and 36.43 g of tetraethoxysilane. There was obtained 73.1 g of a concentrated solution, which had a nonvolatile content of 28.7% by weight. GPC analysis indicated a weight average molecular weight of 2,105.

Preparation Example 6

With stirring at room temperature, a mixture of 45.4 g of methyltrimethoxysilane and 101.5 g of tetraethoxysilane was added to a solution of 0.18 g of conc. nitric acid in 261 g of ultrapure water. The reaction solution gradually liberated heat and reached 50° C., but resumed room temperature after 30 minutes. Stirring was continued in this state for 12 hours. Then 225 g of PGMEA and 75 g of 2-methylpentane-2,4-diol (solvent having porogen nature) were added to the reaction solution whereupon using an evaporator, the low-boiling solvent was distilled off under subatmospheric pressure. During the step, the evaporator was kept in a bath at a temperature below 30° C. To the residual solution were added 500 ml of toluene and 500 ml of ultrapure water. This was transferred to a separatory funnel, from which the water layer was removed. The organic layer was washed twice with 200 ml of ultrapure water. The organic layer was placed in an evaporator where the solvent was distilled off, yielding 208 g of the solution, which is a gas-permeable film-forming composition mother liquid. This solution had a nonvolatile content of 20.0% by weight. GPC analysis indicated a weight average molecular weight of 3,113.

Preparation Example 7

Synthesis was performed as in Preparation Example 6 except that 0.11 g of conc. sulfuric acid was used instead of the nitric acid. There was obtained 202 g of a concentrated solution, which had a nonvolatile content of 22.2% by weight. GPC analysis indicated a weight average molecular weight of 3,534.

Preparation Example 8

Synthesis was performed as in Preparation Example 6 except that 0.31 g of conc. hydrochloric acid was used instead of the nitric acid. There was obtained 210 g of a concentrated solution, which had a nonvolatile content of 20.3% by weight. GPC analysis indicated a weight average molecular weight of 1,995.

Preparation Example 9

With stirring at room temperature, a mixture of 45.4 g of methyltrimethoxysilane and 101.5 g of tetraethoxysilane was added to a solution of 0.18 g of conc. nitric acid in 261 g of ultrapure water. The reaction solution gradually liberated heat and reached 50° C., but resumed room temperature after 30 minutes. Stirring was continued in this state for 12 hours. Then 300 g of PGMEA was added to the reaction solution whereupon using an evaporator, the low-boiling solvent was distilled off under subatmospheric pressure. During the step, the evaporator was kept in a bath at a temperature below 30° C. To the residual solution were added 500 ml of toluene and 500 ml of ultrapure water. This was transferred to a separatory funnel, from which the water layer was removed. The organic layer was washed twice with 200 ml of ultrapure water. The organic layer was placed in an evaporator where the solvent was distilled off, yielding 210 g of the solution, which is a gas-permeable film-forming composition mother liquid. This solution had a nonvolatile content of 20.3% by weight. GPC analysis indicated a weight average molecular weight of 3,062.

Preparation Example 10

Synthesis was performed as in Preparation Example 9 except that 0.11 g of conc. sulfuric acid was used instead of the nitric acid. There was obtained 205 g of a concentrated solution, which had a nonvolatile content of 22.4% by weight. GPC analysis indicated a weight average molecular weight of 3,522.

Preparation Example 11

Synthesis was performed as in Preparation Example 9 except that 0.31 g of conc. hydrochloric acid was used instead of the nitric acid. There was obtained 213 g of a concentrated solution, which had a nonvolatile content of 20.6% by weight. GPC analysis indicated a weight average molecular weight of 1,988.

Formation of Gas-Permeable Layer

A spin coater system DSPN-60 (Dainippon Screen Mfg. Co., Ltd.) was used in the steps of coating and heating at 120° C. and 230° C. A sintering furnace AVF-601 (Dainippon Screen Mfg. Co., Ltd.) was used in the sintering step.

The solutions of silicon oxide base polymers obtained in Preparation Examples 1 to 11 were dropped on silicon wafers, spin coated at a rotational speed of 1500 rpm, baked at 120° C. for 2 minutes and at 230° C. for 2 minutes, and heated at 425° C. for one hour, forming porous films having a thickness of about 100 nm. In this way, gas-permeable films G1 to G11 were obtained from the gas-permeable film-forming compositions of Preparation Examples 1 to 11, respectively.

CVD Formation of Gas-Permeable Layer

A plasma-enhanced CVD apparatus was operated by feeding tetravinyltetramethylcyclotetrasiloxane as a reactant and helium as a carrier gas and producing plasma at an RF power of 200 W. A porous organic silicon oxide film of 500 nm thick was deposited on a silicon wafer. This is designated gas-permeable film G12.

Measurement of Pores

The film as coated or deposited was determined for porosity by an Ellipsometric Porosimeter EP12 (SOPRA) using toluene vapor. The measurement results are shown in Table 1 wherein pores with a radius of more than 1 nm are mesopores and pores with a radius equal to or less than 1 nm are micropores.

TABLE 1

| Gas-permeable film | Mesopores | Micropores |
| --- | --- | --- |
| G1 | found | — |
| G2 | found | — |
| G3 | found | — |
| G4 | found | — |
| G5 | found | — |
| G6 | a few | found |
| G7 | a few | found |
| G8 | a few | found |
| G9 | nil | nil |
| G10 | nil | nil |
| G11 | nil | nil |
| G12 | found | — |

Examples 1 to 12 and Comparative Examples 1 to 3

Formation of Bond Layer Precursor Coating

A spin coater system DSPN-60 (Dainippon Screen Mfg. Co., Ltd.) was used in the steps of coating and B-staging. Onto the silicon wafer having the gas-permeable layer formed thereon, the solution of silicon oxide polymer obtained in Preparation Example 9 as a bond layer precursor coating-forming composition was dropped and spin coated at a rotational speed of 1500 rpm and baked at 120° C. for 2 minutes and at 230° C. for 2 minutes. There was obtained a substrate having a B-staged bond layer precursor coating of about 120 nm thick, designated substrate G#A wherein # corresponds to the number of Preparation Example where a substrate having gas-permeable layer was prepared.

By the same procedure, a B-staged bond layer precursor coating was formed on a silicon wafer not having a gas-permeable layer. This is designated substrate A. Also by the same procedure, a B-staged bond layer precursor coating was formed on a silicon wafer having a silicon oxide film of 100 nm deposited by plasma-enhanced CVD using tetraethoxysilane (TEOS). This is designated substrate OA.

Bonding Test

Using a wafer bonding system EVG520 (EV Group) which is designed to heat an assembly of precursor coating between two substrates under pressure in a vacuum atmosphere, two substrates of the following combination were joined together. Two substrates were mated with the precursor coating inside and set in the system where after application of a load of 3000 N and evacuation to a vacuum of 1000 Pa, the assembly was heated at 350° C. for 5 minutes to form a bond layer. After the completion of joining step, the substrates were inspected by a ultrasonic imager to see whether or not voids were formed.

TABLE 2

|  | Substrate 1 | Substrate 2 | Bond | Voids |
| --- | --- | --- | --- | --- |
| Example 1 | G1A | G1 | good | nil |
| Example 2 | G2A | G2 | good | nil |
| Example 3 | G3A | G3 | good | nil |
| Example 4 | G4A | G4 | good | nil |
| Example 5 | G5A | G5 | good | very small |
| Example 6 | G6A | G6 | good | very small |
| Example 7 | G7A | G7 | good | very small |
| Example 8 | G8A | G8 | good | very small |
| Example 9 | G9A | G9 | good | small |
| Example 10 | G10A | G10 | good | small |
| Example 11 | G11A | G11 | good | small |
| Example 12 | G12A | G12 | good | — |
| Comparative Example 1 | A | N | peeled | — |
| Comparative Example 2 | A | A | peeled | — |
| Comparative Example 3 | OA | O | peeled | — |

G#A: substrate in the form of silicon wafer having a gas-permeable film of Preparation Example # formed and a bond layer precursor coating formed further thereon
G#: substrate in the form of silicon wafer having a gas-permeable film of Preparation Example # formed thereon
A: substrate in the form of silicon wafer having a bond layer precursor coating formed thereon
N: silicon wafer without a bond layer precursor coating or gas-permeable layer
OA: substrate in the form of silicon wafer having a 100-nm silicon oxide film formed by CVD-TEOS and a bond layer precursor coating formed further thereon
O: silicon wafer having a 100-nm silicon oxide film formed by CVD-TEOS As seen from Table 2, when bare silicone wafers or substrates having a $SiO_2$ film deposited by plasma CVD of TEOS were joined using a bond layer precursor coating adapted to cure through dehydration condensation, prominent spaces were formed in the bond layer when water was produced near partially bonded portions and liberated outside therefrom, failing to achieve a coextensive bond layer. In contrast, in Examples 1 to 12 where a gas-permeable layer was formed, distinct spaces indicative of tracks for water escape were not formed. In Examples 6 to 8 where the gas-permeable layer mainly contained micropores, some voids of no significance were observed. In Examples 8 to 11 having the gas-permeable layer in which few micropores were observed, small voids were observed, but could be solved by tailoring bonding conditions.

A bond layer precursor coating of the type that will evolve gas upon heat curing is capable of forming a bond which is stable at high temperature, but regarded difficult to join substrates together therewith. Now that a substrate to be joined is provided on its surface with a gas-permeable layer, a bond which is stable at high temperature can be formed between substrates using a bond layer precursor coating of the type.

Japanese Patent Application No. 2008-209194 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for joining integrated circuit substrates together, comprising the steps of joining a pair of integrated circuit substrates each having a bonding surface with a bond layer precursor coating interposed between the integrated circuit substrate bonding surfaces, and heating the precursor coating to form a bond layer, the method further comprising the step of providing one or both of the integrated circuit substrates bonding surfaces directly with a porous gas-permeable layer prior to the joining step, said bond layer precursor coating being formed by using a material which evolves gas through reaction when heat cured into the bond layer.

2. The method of claim 1 wherein said porous gas-permeable layer is formed by applying a coating composition comprising a silicon base material and heating the coating so as to be gas permeable.

3. The method of claim 2 wherein the silicon base material is a silicon oxide base material.

4. The method of claim 3 wherein the silicon oxide base material comprises an organic silicon oxide compound.

5. The method of claim 1 wherein said porous gas-permeable layer is a porous film formed by CVD method and having a dielectric constant k of up to 3.

6. A method for joining integrated circuit substrates together, comprising the steps of joining a pair of integrated circuit substrates each having a bonding surface with a bond layer precursor coating interposed between the integrated circuit substrate bonding surfaces, and heating the precursor coating to form a bond layer, the method further comprising the step of providing one or both of the integrated circuit substrates bonding surfaces directly with a porous gas-permeable layer prior to the joining step, by applying a silicon oxide base film-forming composition comprising an inorganic or organic silicon oxide base polymer directly onto one or both of the substrate bonding surfaces and processing the composition into a silicon oxide base film serving as the porous gas-permeable layer, said bond layer precursor coating being formed by using a material which evolves gas through reaction when heat cured into the bond layer.

7. The method of claim 1 wherein said bond layer precursor coating is a coating comprising an inorganic or organic silicon oxide base polymer.

8. The method of claim 2 wherein said silicon base material is a silicon oxide base polymer of which the starting reactant is a hydrolyzable silane compound comprising a tetrafunctional alkoxysilane compound of the general formula (1):

$$Si(OR^1)_4 \quad (1)$$

wherein $R^1$ is a straight or branched $C_1$-$C_4$ alkyl group, four $R^1$ may be each independently the same or different, and a hydrolyzable silane compound of the general formula (2):

 (2)

wherein $R^2$ is a straight or branched $C_1$-$C_4$ alkyl group, and when a plurality of R2 are included, they may each independently the same or different; $R^3$ is an optionally substituted, straight or branched $C_1$-$C_8$ alkyl group, and when a plurality of $R^3$ are included, they may be each independently the same or different; and m is an integer of 1 to 3.

9. The method of claim 2 wherein said silicon base material is a silicon oxide base polymer of which the starting reactant comprises a silane compounds of the above formulae (1) and (2) wherein m=1, and a hydrolyzable silane compound capable of forming at least three crosslinks composed of oxygen atom and/or hydrocarbon, as represented by the following general formulae (3), (4) (5):

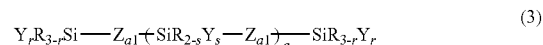 (3)

 (4)

 (5)

wherein a is an integer of 1 to 20, r is each independently an integer of 1 to 3, s is an integer of 0 to 2, with the proviso that when all r's are 1, all s's are not equal to 0, b is an integer of 2 to 6, t is an integer of 0 to 2, not all t's being equal to 0, c is an integer of 1 to 4, with the proviso that when c is 1, all r's are not equal to 1; R is an optionally substituted, straight or branched $C_1$-$C_8$ alkyl group and when a plurality of R are included, they may be each independently the same or different; Y is each independently hydrogen, hydroxyl or $C_1$-$C_4$ alkoxy: $Z_{a1}$ is a divalent, optionally cyclic structure-containing straight or branched, or cyclic $C_1$-$C_{10}$ aliphatic hydrocarbon group which may be substituted, and $Z_x$ is an optionally cyclic structure- containing straight or branched, or cyclic (c+1)-valent $C_1$-$C_{10}$ aliphatic hydrocarbon group or an aromatic ring-containing $C_6$-$C_{12}$ hydrocarbon group.

10. The method of claim 5 wherein said porous film is formed by using a material comprising a cyclic siloxane compound having hydrocarbon and alkoxy groups, as represented by the general formula (6):

 (6)

wherein $R^4$ is an optionally cyclic structure-containing, straight or branched, saturated or unsaturated aliphatic hydrocarbon group of 1 to 10 carbon atoms, Y is each independently hydrogen, hydroxyl, or $C_1$-$C_4$, alkoxy, p is an integer of 0 to 2, with the proviso that when $R^4$ is saturated aliphatic hydrocarbon group, not all p's are equal to 0, and q is an integer of 3 to 5.

* * * * *